(12) United States Patent
Ma

(10) Patent No.: US 8,493,072 B2
(45) Date of Patent: Jul. 23, 2013

(54) METHOD AND APPARATUS FOR DETECTING A SHORT CIRCUIT

(75) Inventor: Xiang Ma, Shanghai (CN)

(73) Assignee: Koninklijke Philips N.V., Eindhoven (NL)

( * ) Notice: Subject to any disclaimer, the term of this patent is extended or adjusted under 35 U.S.C. 154(b) by 326 days.

(21) Appl. No.: 13/039,813

(22) Filed: Mar. 3, 2011

(65) Prior Publication Data

US 2011/0221449 A1   Sep. 15, 2011

Related U.S. Application Data

(60) Provisional application No. 61/312,044, filed on Mar. 9, 2010.

(51) Int. Cl.
*G01R 31/02* (2006.01)

(52) U.S. Cl.
USPC .......................................... 324/537; 324/555

(58) Field of Classification Search
USPC ................. 324/537, 500, 541, 544, 555, 509, 324/512, 525
See application file for complete search history.

(56) References Cited

U.S. PATENT DOCUMENTS

| | | | |
|---|---|---|---|
| 3,602,215 A | 8/1971 | Parnell | |
| 4,577,639 A | 3/1986 | Simon | |
| 5,002,064 A | 3/1991 | Allain | |
| 5,231,990 A | 8/1993 | Gauglitz | |
| 5,754,103 A * | 5/1998 | Kanai et al. | 340/507 |
| 6,806,718 B2 * | 10/2004 | Berkely | 324/500 |
| 2005/0110526 A1 * | 5/2005 | Ishibashi et al. | 327/18 |
| 2008/0285193 A1 * | 11/2008 | Watanabe et al. | 361/88 |

* cited by examiner

*Primary Examiner* — Hoai-An D Nguyen

(57) ABSTRACT

This invention provides a method and an apparatus for detecting a short-circuit occurring between a signal line and a ground line of a lead wire. The apparatus comprises a circuit and a resistive element. The circuit has an output terminal, an input terminal and ground. One end of the ground line is connected to the ground of the circuit, and the other end of the ground line is disconnected. A first terminal of the resistive element is connected to the output terminal of the circuit. One end of the signal line is connected to a second terminal of the resistive element, and the other end of the signal line is disconnected. The circuit is configured to provide a first voltage via the output terminal and obtain a second voltage via the input terminal connected to a joint of the signal line and the resistive element, to provide a third voltage via the output terminal and obtain a fourth voltage via the input terminal, to derive an impedance of the lead wire from the first voltage, the second voltage, the third voltage, the fourth voltage and an impedance of the resistive element, and to determine whether a short-circuit occurs or not, based on the impedance of the lead wire and a predefined impedance. In this way, the shorted lead wire can be detected with high accuracy.

11 Claims, 2 Drawing Sheets

METHOD AND APPARATUS FOR DETECTING A SHORT CIRCUIT

FIELD OF THE INVENTION

The invention relates to the detection of a short-circuit, in particular to a method and an apparatus for detecting a short-circuit occurring between a signal line and a ground line of a lead wire.

BACKGROUND OF THE INVENTION

Electrocardiography is an interpretation of the electrical activity of the heart captured by skin electrodes and externally recorded by an electrocardiograph, and the whole process is a non-invasive recording process.

During an electrocardiographic examination, lead wires are used to connect the electrocardiograph and the skin electrodes to a patient. A typical lead wire includes two metal lines: one is a signal line and the other is a ground line. The signal line and the ground line are separated by an insulating layer, so that the signal line and the ground line cannot touch each other. The signal line is connected to the patient by the skin electrodes and is the main part for transmitting the electronic heart signal; the ground line is connected to the ground of the electrocardiograph and is designed to cancel noises which may cause interference to the electronic signal transmission in the signal line.

When used in clinics, the lead wire is twisted every day when a nurse connects the skin electrodes to the patient, and the insulating layer between the signal line and ground line may break sooner or later. If the insulating layer is broken, the signal line may be connected with the ground line, which results in incorrect electrocardiogram output and a wrong diagnosis. When the insulating layer is broken and a short-circuit occurs between the signal line and the ground line (i.e. the signal line is connected with the ground line), the lead wire is referred to as a shorted lead wire. The shorted lead wire may cause intermittent signal loss, signal noise or decreased signal amplitude.

U.S. Pat. No. 3,602,215A1 provides an apparatus for detecting failure of a set of lead means used in conjunction with an EGG amplifier. The apparatus includes a constant current source connected to the individual lead means for generating a voltage representative of the transmission impedance of the lead means. Amplifying and level detecting means are connected to the lead means for generating trigger pulses indicative of lead failure whenever the transmission impedance of the lead means exceeds a predetermined magnitude. An indicator means driven by the trigger pulses is included to indicate the occurrence of lead failure.

SUMMARY OF THE INVENTION

The inventor of the present invention has recognized that when the impedance of the lead wire is measured for detecting a short in the lead wire, there may be a big error in the impedance measured by a shorted lead wire detecting apparatus, because a leakage current may occur in the apparatus due to leakage currents in the semiconductor elements comprised in the apparatus. The intensity of the leakage current in the shorted lead wire detecting apparatus may be similar to the intensity of the current flowing through a shorted lead wire, so the leakage current may have a strong negative effect on the accuracy of the measured impedance of the lead wire. Furthermore, it is difficult to estimate the impact of the leakage current because the internal structure of the shorted lead wire detecting apparatus for detecting the short-circuit may be complicated.

U.S. Pat. No. 3,602,215A1 only provides a solution for detecting failure of a set of lead means, but it cannot solve the problem of inaccurate detection caused by the leakage current in the apparatus for detecting failure of lead means.

Based on the understanding of the prior art and the problems described above, it would be advantageous to detect the shorted lead wire accurately even if there is a heavy leakage current in the shorted lead wire detecting apparatus.

To better address one or more of the above concerns, according to an embodiment of a first aspect of the invention, an apparatus for detecting a short-circuit occurring between a signal line and a ground line of a lead wire is provided. The apparatus comprises:

a circuit having an output terminal, an input terminal and ground, the ground of the circuit being connected to one end of the ground line, the other end of the ground line being disconnected;

a resistive element having a first terminal connected to the output terminal of the circuit and a second terminal connected to one end of the signal line, the other end of the signal line being disconnected; wherein the circuit is configured to provide a first voltage via the output terminal and obtain a second voltage via the input terminal, the input terminal being connected to a joint of the signal line and the resistive element, to provide a third voltage via the output terminal and obtain a fourth voltage via the input terminal, to derive an impedance of the lead wire from the first voltage, the second voltage, the third voltage, the fourth voltage and an impedance of the resistive element, and to determine whether a short-circuit occurs or not, based on the derived impedance of the lead wire and a predefined impedance.

The basic idea is to decrease the impedance measurement error caused by the leakage current by calculating the impedance of the lead wire on the basis of two groups of voltage values. One group of voltage values comprises the first voltage and the second voltage, and the other group of voltage values comprises the third voltage and the fourth voltage. Assuming that the leakage current in the circuit remains unchanged when the circuit provides different output voltages via the output terminal, based on the two groups of different voltage values, the impact of the leakage current can be reduced or eliminated by carefully designing the method of deriving the lead wire's impedance. In this way, the impedance of the lead wire can be obtained accurately and then a short in the lead wire can be detected accurately so that a wrong diagnosis may be avoided.

According to an embodiment of a second aspect of the invention, a method of detecting a short-circuit occurring between a signal line and a ground line of a lead wire is provided. The method comprises:

providing a circuit having an output terminal, an input terminal and ground, the ground of the circuit being connected to one end of the ground line, the other end of the ground line being disconnected;

providing a resistive element having a first terminal connected to the output terminal of the circuit and a second terminal connected to one end of the signal line, the other end of the signal line being disconnected;

providing a first voltage via the output terminal and obtaining a second voltage via the input terminal, the input terminal being connected to a joint of the signal line and the resistive element by the circuit;

providing a third voltage via the output terminal and obtaining a fourth voltage via the input terminal;

deriving an impedance of the lead wire from the first voltage, the second voltage, the third voltage, the fourth voltage and an impedance of the resistive element; and determining whether a short-circuit occurs or not, based on the derived impedance of the lead wire and a predefined impedance.

These and other aspects of the invention will be apparent from and elucidated with reference to the embodiments described hereinafter.

DESCRIPTION OF THE DRAWINGS

The above and other objects and features of the present invention will become more apparent from the following detailed description considered in connection with the accompanying drawings, in which.

The same reference numerals are used to denote similar parts throughout the Figures.

DETAILED DESCRIPTION

Figure 1:
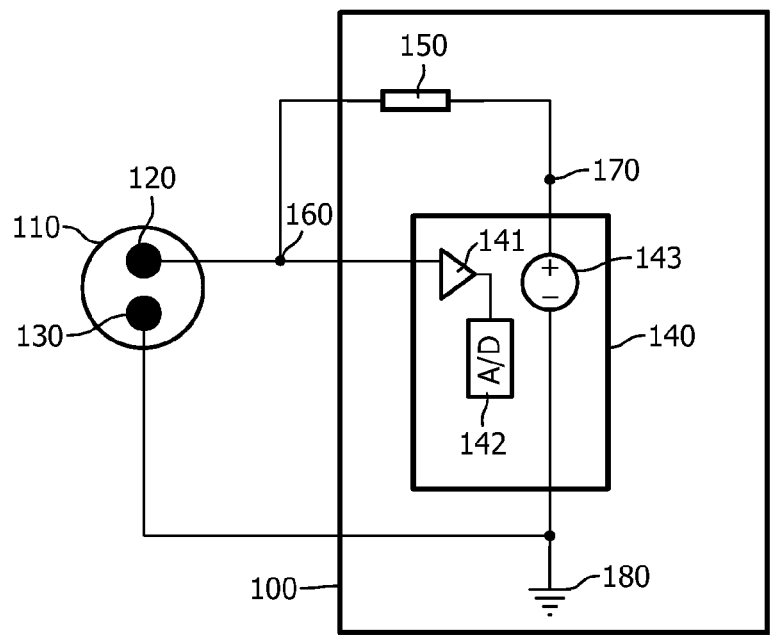
FIG. 1 depicts a schematic diagram of an apparatus in accordance with an embodiment of the present invention.

FIG. 1 depicts a schematic diagram of an apparatus in accordance with an embodiment of the present invention.

According to an embodiment of a first aspect of the invention, an apparatus 100 for detecting a short-circuit occurring between a signal line 120 and a ground line 130 of a lead wire 110 is provided.

The lead wire 110 includes the signal line 120 and the ground line 130. To prevent a short-circuit occurring between the signal line and the ground line, there is an insulating layer, such as a rubber layer, covering the signal line, between the signal line and the ground line.

Referring to FIG. 1, the apparatus 100 comprises a circuit 140 and a resistive element 150.

The circuit 140 has an output terminal 170, an input terminal 190 and ground 180.

The output terminal 170 is configured to output a voltage. The circuit 140 can output a voltage via the output terminal 170 in many ways. For example, the circuit 140 comprises a DC (Direct Current) voltage source 143 and the output terminal 170 is one of the output terminals of the DC voltage source. How to provide a voltage source is known to the person skilled in the art and is not further elaborated here.

The output terminal 170 of the circuit 140 is connected to a first terminal of the resistive element 150. A second terminal of the resistive element 150 is connected to one end of the signal line 120, while the other end of the signal line 120 is disconnected. That is to say that the other end of the signal line 120 is not connected to anything. One end of the signal line can be connected to the second terminal of the resistive element in many ways, such as via a clip or a socket. The resistive element 150 can be implemented in many ways, such as the resistor 150 shown in FIG. 1 or two resistors connected in series or in parallel.

The input terminal 190 of the circuit 140 is configured to obtain a voltage at a point by connecting the input terminal 190 to the point. The circuit 140 can obtain a voltage via the input terminal 190 in many ways. For example, the circuit 140 comprises an amplifier circuit 141 for amplifying the measured voltage at the input terminal 190 and the A/D converter circuit 142 for converting the measured voltage into a digital value. How to obtain a voltage is known to the person skilled in the art and is not further elaborated here.

The ground 180 of the circuit 140 is connected to one end of the ground line 130, and the other end of the ground line 130 is disconnected. That is to say that the other end of the ground line 130 is not connected to anything. One end of the ground line can be connected to the ground of the circuit 140 in many ways, such as via a clip or a socket.

The ground of the circuit can be the circuit's analog ground, which is connected with the circuit's digital ground, or it can be the circuit's analog ground which has an electric potential different from that of the circuit's digital ground, for example, the electric potential of the circuit's analog ground is 2.5 v higher than the electric potential of the circuit's digital ground.

The signal line 120 is connected to the circuit 140 via the resistive element 150 and the ground line 130 is also connected to the circuit 140 via the ground 180, therefore, when a short-circuit occurs between the signal line 120 and the ground line 130, a closed loop is formed by the signal line 120, the ground line 130, the resistive element 150 and the circuit 140; and when there is no short-circuit between the signal line 120 and the ground line 130, the closed loop described above is open. Therefore, when the input terminal 190 is connected to a joint 160 of the signal line 120 and the resistive element 150, the voltage obtained by the circuit 140 via the input terminal 190 for a good lead wire is different from the voltage obtained by the circuit 140 via the input terminal 190 for a shorted lead wire. Consequently, based on the voltages obtained by the circuit 140, the derived impedance of the good lead wire is different from that of the shorted lead wire.

In order to determine the impedance of the lead wire 110, firstly, the circuit 140 is configured to provide a first voltage via the output terminal 170 and obtain a second voltage via the input terminal 190 connected to the joint 160 of the signal line 120 and the resistive element 150. Then, the circuit 140 is configured to provide a third voltage via the output terminal 170 and obtain a fourth voltage via the input terminal 190. Finally, the circuit 140 is configured to derive the impedance of the lead wire 110 from the first voltage, the second voltage, the third voltage, the fourth voltage and the impedance of the resistive element 150.

To decrease the impact of the leakage current in the apparatus 100 (i.e. the leakage current in the circuit 140), the first voltage is different from the third voltage and then two groups of voltage values can be obtained: one group of voltage values comprises the first voltage and the second voltage; and the other group of voltage values comprises the third voltage and the fourth voltage. However, there are some unavoidable measurement errors in the two groups of voltage values. By increasing the difference between the first voltage and the third voltage, the measurement errors in the two groups of voltage values will have less effect on the derived impedance of the lead wire 110 and then there will be a smaller error in the derived impedance of the lead wire 110.

To increase the difference between the first voltage and the third voltage, in one embodiment, the first voltage is a highest input voltage of the circuit 140 and the third voltage is a lowest input voltage of the circuit 140. For example, the first voltage is 400 mv and the third voltage is −400 mv. For another example, the first voltage is 800 mv and the third voltage is 0 mv. The highest input voltage and the lowest input voltage can be determined in many ways. For example, as shown in FIG. 1, the circuit 140 comprises an A/D (analog to digital) converter circuit 142, and the highest input voltage and the lowest input voltage can be determined according to the dynamic input range of the A/D converter circuit 142.

After the impedance of the lead wire 110 is derived, the circuit 140 is further configured to determine whether a short-circuit occurs or not, based on the impedance of the lead wire 110 and a predefined impedance. If the impedance of the lead wire 110 exceeds the predefined impedance, the lead wire 110 is denoted as a good lead wire; and if the impedance of the lead wire 110 does not exceed the predefined impedance, the lead wire 110 is denoted as a shorted lead wire.

The predefined impedance can be determined in many ways. For example, the average of the impedances of several good lead wires can be set as the predefined impedance. In one embodiment, the predefined impedance is in the range of [10MΩ to 50MΩ].

The circuit 140 can derive the impedance of the lead wire 110 in many ways from the first voltage, the second voltage, the third voltage, the fourth voltage and the impedance of the resistive element 150.

In an embodiment, the circuit 140 derives the impedance of the lead wire 110 by using equation 1.

$$R_x = R \cdot \frac{(V_1 - V_3)}{((V_1 - V_2) - (V_3 - V_4))} - R \qquad \text{Equation 1}$$

In equation 1, $R_x$ is the impedance of the lead wire 110, R is the impedance of the resistive element 150, $V_1$ is the first voltage, $V_2$ is the second voltage, $V_3$ is the third voltage, and $V_4$ is the fourth voltage.

Figure 2:
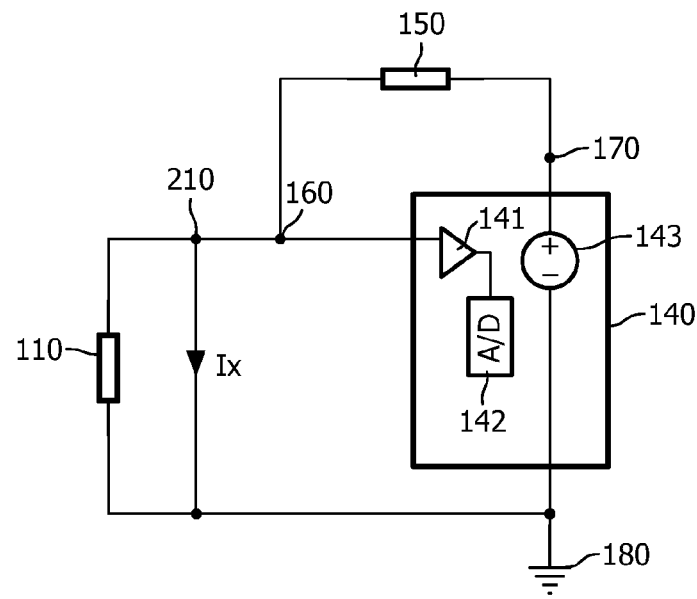
FIG. 2 depicts a schematic diagram of an apparatus in accordance with another embodiment of the present invention.

FIG. 2 depicts a schematic diagram of an apparatus in accordance with another embodiment of the present invention.

Referring to FIG. 2, there is a leakage current $I_x$ generated by the circuit 140.

When the circuit 140 provides the first voltage $V_1$ via the output terminal 170 and obtains the second voltage $V_2$ at the joint 160, according to Kirchhoff's current law, the current source at the joint 210 should follow equation 2.

$$\frac{V_1 - V_2}{R} + \frac{(0 - V_2)}{R_x} + I_x = 0 \qquad \text{Equation 2}$$

When the circuit 140 provides the third voltage $V_3$ via the output terminal 170 and obtains the second voltage $V_4$ at the joint 160, similarly, the current source at the joint 210 should follow equation 3.

$$\frac{V_3 - V_4}{R} + \frac{(0 - V_4)}{R_x} + I_x = 0 \qquad \text{Equation 3}$$

Based on equation 2 and equation 3, equation 1 can be obtained by assuming the leakage current remains unchanged. In this way, the impact of the leakage current can be eliminated and the impedance of the lead wire 140 can be calculated accurately.

In another embodiment, the circuit 140 derives the impedance of the lead wire 110 by using equation 4 when the impedance of the resistive element 150 is much lower than the impedance of the lead wire 110, for example, the impedance of the resistive element 150 is 10KΩ.

$$R_x = R \cdot \frac{(V_1 - V_3)}{((V_1 - V_2) - (V_3 - V_4))} \qquad \text{Equation 4}$$

Figure 3:
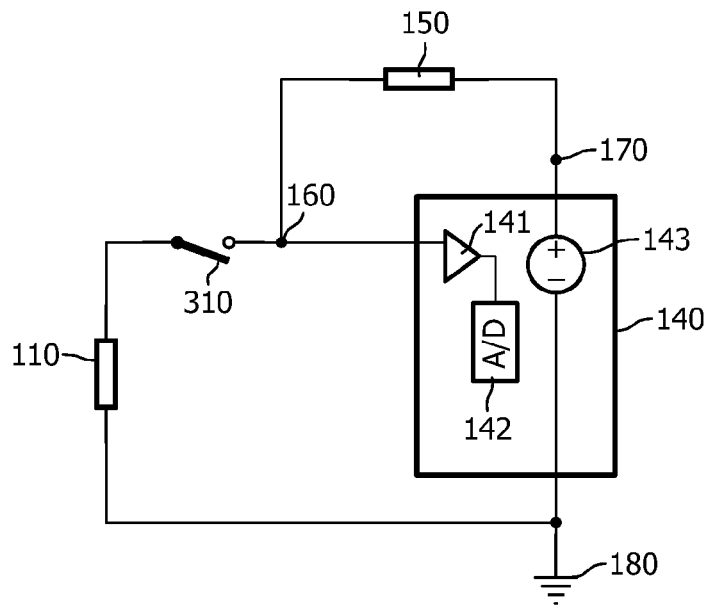
FIG. 3 depicts a schematic diagram of an apparatus in accordance with a further embodiment of the present invention.

FIG. 3 depicts a schematic diagram of an apparatus in accordance with a further embodiment of the present invention.

In an embodiment, the connection between the signal line 120 and the resistive element 150 is interrupted. For example, as shown in FIG. 3, the connection between the signal line 120 and the resistive element 150 is interrupted by a switch 310. The switch 310 can be controlled manually by an operator or automatically by the circuit 140. The circuit 140 is configured to provide the first voltage via the output terminal 170 and obtain the first voltage via the input terminal 190 connected to the second terminal of the resistive element 150. The circuit 140 is further configured to provide the third voltage via the output terminal 170 and obtain the third voltage via the input terminal 190 connected to the second terminal of the resistive element 150. In this way, the first voltage and the third voltage are calibrated before they are used for deriving the impedance of the lead wire 110, and the short-circuit can be correctly detected even if the voltage output by the circuit 140 is not well controlled by the circuit 140.

The circuit 140 described above can be implemented by a processor, a microprocessor, an integrated chipset or several separated component circuits.

The apparatus can be implemented in many ways, for example as a separate apparatus for detecting a short-circuit or as an electrocardiogram apparatus which can be used both for an electrocardiographic examination and for short-circuit detection. If the apparatus is an electrocardiogram apparatus, it would be very convenient to detect a short-circuit always before the electrocardiographic examination, so that the detected shorted lead wire can be replaced timely. In addition, the interfaces (e.g. sockets) on the electrocardiogram apparatus for connecting the lead wires can be also used to connect one end of the signal line to the resistive element and to connect one end of the ground line to the ground of the circuit so as to perform a shorted lead wire detection operation.

Figure 4:
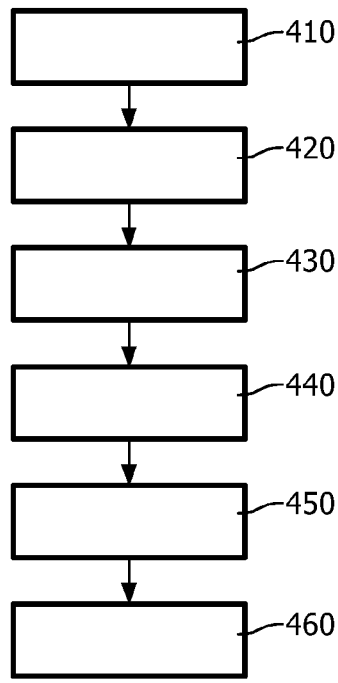
FIG. 4 depicts a flow chart of a method in accordance with an embodiment of the present invention.

FIG. 4 depicts a flow chart of a method in accordance with one embodiment of the present invention.

According to an embodiment of a second aspect of the present invention, a method of detecting a short-circuit occurring between a signal line 120 and a ground line 130 of a lead wire 110 is provided.

Referring to FIG. 4, the method comprises a step 410 of providing a circuit 140 having an output terminal 170, an input terminal 190 and ground 180. The ground 180 of the circuit 140 is connected to one end of the ground line 130, and the other end of the ground line 130 is disconnected.

The method further comprises a step 420 of providing a resistive element 150 having a first terminal connected to the output terminal 170 of the circuit 140 and a second terminal connected to one end of the signal line 120. The other end of the signal line 120 is disconnected.

The method further comprises a step 430 of providing a first voltage via the output terminal 170 and obtaining a second voltage via the input terminal 190 connected to a joint 160 of the signal line 120 and the resistive element 150 by the circuit 140.

The method further comprises a step 440 of providing a third voltage via the output terminal 170 and obtaining a fourth voltage via the input terminal 190 connected to the joint 160 of the signal line 120 and the resistive element 150 by the circuit 140. The first voltage is different from the third voltage. In an embodiment, the first voltage is a highest input voltage of the circuit 140 and the third voltage is a lowest input voltage of the circuit 140.

The method further comprises a step 450 of deriving an impedance of the lead wire 110 from the first voltage, the second voltage, the third voltage, the fourth voltage and an impedance of the resistive element 150.

The method further comprises a step 460 of determining whether a short-circuit occurs or not, based on the impedance of the lead wire 110 and a predefined impedance. If the impedance of the lead wire 110 exceeds the predefined impedance, the lead wire 110 is denoted as a good lead wire; and if the impedance of the lead wire 110 does not exceed the predefined impedance, the lead wire 110 is denoted as a shorted lead wire.

The step 450 can be implemented in many ways. In an embodiment, the impedance of the lead wire 110 is derived by using equation 1. In another embodiment, the impedance of the lead wire 110 is derived by using equation 4.

A voltage output by the circuit 140 via the output terminal 170 can be calibrated in many ways.

In an embodiment of the method, before the step 450, the method further comprises a step of interrupting the connection between the signal line 120 and the resistive element 150; and providing the first voltage via the output terminal 170 and obtaining the first voltage via the input terminal 190 connected to the second terminal of the resistive element 150 by the circuit 140.

In another embodiment of the method, before the step 450, the method further comprises a step of interrupting the connection between the signal line 120 and the resistive element 150; and providing the third voltage via the output terminal 170 and obtaining the third voltage via the input terminal 190 connected to the second terminal of the resistive element 150 by the circuit 140.

It should be noted that the above-mentioned embodiments illustrate rather than limit the invention and that those skilled in the art will be able to design alternative embodiments without departing from the scope of the appended claims. In the claims, any reference signs placed between parentheses shall not be construed in a limiting sense. The word "comprising" does not exclude the presence of elements or steps not listed in a claim or in the description. The word "a" or "an" preceding an element does not exclude the presence of a plurality of such elements. In the apparatus claims enumerating several units, several of these units can be embodied by one and the same item of hardware or software. Usage of the words first, second and third, et cetera, does not indicate any ordering. These words are to be interpreted as names.

The invention claimed is:

1. An apparatus for detecting a short-circuit occurring between a signal line (120) and a ground line (130) of a lead wire (110), comprising:
    a circuit (140) having an output terminal (170), an input terminal (190) and ground, the ground (180) of the circuit (140) being connected to one end of the ground line (130), the other end of the ground line (130) being disconnected;
    a resistive element (150) having a first terminal connected to the output terminal (170) of the circuit (140) and a second terminal connected to one end of the signal line (120), the other end of the signal line (120) being disconnected; wherein the circuit (140) is configured
    to provide a first voltage via the output terminal (170) and obtain a second voltage via the input terminal (190), the input terminal (190) being connected to a joint (160) of the signal line (120) and the resistive element (150),
    to provide a third voltage via the output terminal (170) and obtain a fourth voltage via the input terminal (190),
    to derive an impedance of the lead wire (110) from the first voltage, the second voltage, the third voltage, the fourth voltage and an impedance of the resistive element (150), and
    to determine whether a short-circuit occurs or not, based on the derived impedance of the lead wire (110) and a predefined impedance.

2. An apparatus as claimed in claim 1, wherein the circuit (140) derives the impedance of the lead wire (110) by using the following equation:

$$R_x = R \cdot \frac{(V_1 - V_3)}{((V_1 - V_2) - (V_3 - V_4))} - R$$

wherein $R_x$ is the impedance of the lead wire (110), R is the impedance of the resistive element (150), $V_1$ is the first voltage, $V_2$ is the second voltage, $V_3$ is the third voltage, and $V_4$ is the fourth voltage.

3. An apparatus as claimed in claim 1, wherein the connection between the signal line (120) and the resistive element (150) is interrupted, and the circuit (140) is further configured to provide the first voltage via the output terminal (170) and obtain the first voltage via the input terminal (190), the input terminal (190) being connected to the second terminal of the resistive element (150).

4. An apparatus as claimed in claim 1, wherein the connection between the signal line (120) and the resistive element (150) is interrupted, and the circuit (140) is further configured to provide the third voltage via the output terminal (170) and obtain the third voltage via the input terminal (190), the input terminal (190) being connected to the second terminal of the resistive element (150).

5. An apparatus as claimed in claim 1, wherein the first voltage is a highest input voltage of the circuit (140) and the third voltage is a lowest input voltage of the circuit (140).

6. An apparatus as claimed in claim 1, wherein the apparatus is an electrocardiogram apparatus.

7. A method of detecting a short-circuit occurring between a signal line (120) and a ground line (130) of a lead wire (110), comprising:
    providing (410) a circuit (140) having an output terminal (170), an input terminal (190) and ground, the ground (180) of the circuit (140) being connected to one end of the ground line (130), the other end of the ground line (130) being disconnected;
    providing (420) a resistive element (150) having a first terminal connected to the output terminal (170) of the circuit (140) and a second terminal connected to one end of the signal line (120), the other end of the signal line (120) being disconnected;
    providing (430) a first voltage via the output terminal (170) and obtaining a second voltage via the input terminal (190), the input terminal (190) being connected to a joint (160) of the signal line (120) and the resistive element (150) by the circuit (140);

providing (440) a third voltage via the output terminal (170) and obtaining a fourth voltage via the input terminal (190);

deriving (450) an impedance of the lead wire (110) from the first voltage, the second voltage, the third voltage, the fourth voltage and an impedance of the resistive element (150); and determining (460) whether a short-circuit occurs or not, based on the impedance of the lead wire (110) and a predefined impedance.

8. A method as claimed in claim 7, wherein the step of deriving (450) is performed by using the following equation:

$$R_x = R \cdot \frac{(V_1 - V_3)}{((V_1 - V_2) - (V_3 - V_4))} - R$$

wherein $R_x$ is the impedance of the lead wire (110), R is the impedance of the resistive element (150), $V_1$ is the first voltage, $V_2$ is the second voltage, $V_3$ is the third voltage, and $V_4$ is the fourth voltage.

9. A method as claimed in claim 7, wherein, before the step of deriving (450), further comprises:

interrupting the connection between the signal line (120) and the resistive element (150); and providing the first voltage via the output terminal (170) and obtaining the first voltage via the input terminal (190), the input terminal (190) being connected to the second terminal of the resistive element (150) by the circuit (140).

10. A method as claimed in claim 7, wherein, before the step of deriving (450), further comprises:

interrupting the connection between the signal line (120) and the resistive element (150); and providing the third voltage via the output terminal (170) and obtaining the third voltage via the input terminal (190), the input terminal (190) being connected to the second terminal of the resistive element (150) by the circuit (140).

11. A method as claimed in claim 7, wherein the first voltage is a highest input voltage of the circuit (140) and the third voltage is a lowest input voltage of the circuit (140).

* * * * *